(12) United States Patent
Ross

(10) Patent No.: US 6,535,951 B1
(45) Date of Patent: Mar. 18, 2003

(54) HIT RESULT REGISTER FILE USED IN A CAM

(75) Inventor: Mark A. Ross, San Carlos, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/515,578

(22) Filed: Feb. 29, 2000

(51) Int. Cl.[7] ............................................... G06F 12/02
(52) U.S. Cl. ...................... 711/108; 711/103; 711/151; 711/154
(58) Field of Search ............................... 711/108, 113, 711/154, 151, 170; 365/49

(56) References Cited

U.S. PATENT DOCUMENTS

| | | | | |
|---|---|---|---|---|
| 5,270,591 A | * | 12/1993 | Ross | 327/57 |
| 5,619,446 A | * | 4/1997 | Yoneda et al. | 365/49 |
| 5,806,083 A | * | 9/1998 | Edgar | 711/108 |
| 6,101,115 A | * | 8/2000 | Ross | 365/49 |
| 6,122,706 A | * | 9/2000 | Leong et al. | 711/108 |

* cited by examiner

Primary Examiner—T. V. Nguyen
(74) Attorney, Agent, or Firm—The Law Office of Kirk D. Williams

(57) ABSTRACT

The invention provides a method and system for performing additional processing on CAM hit results, in which the additional processing does not add to the complexity or size of the CAM chip, can be altered after manufacture of the CAM chip, and does not delay other operations of the CAM. The CAM hit results are presented as indices from the CAM and sent to a hit result register file where they are stored. The contents of the hit result register file can be processed by other hardware or software coupled to the CAM. The index associated with the CAM input tag can be accessed using the hit result register file and a register indirect operation. The index associated with the CAM input tag can be used for CAM management functions in conjunction with (such as in parallel or pipelined) other CAM functions.

37 Claims, 3 Drawing Sheets

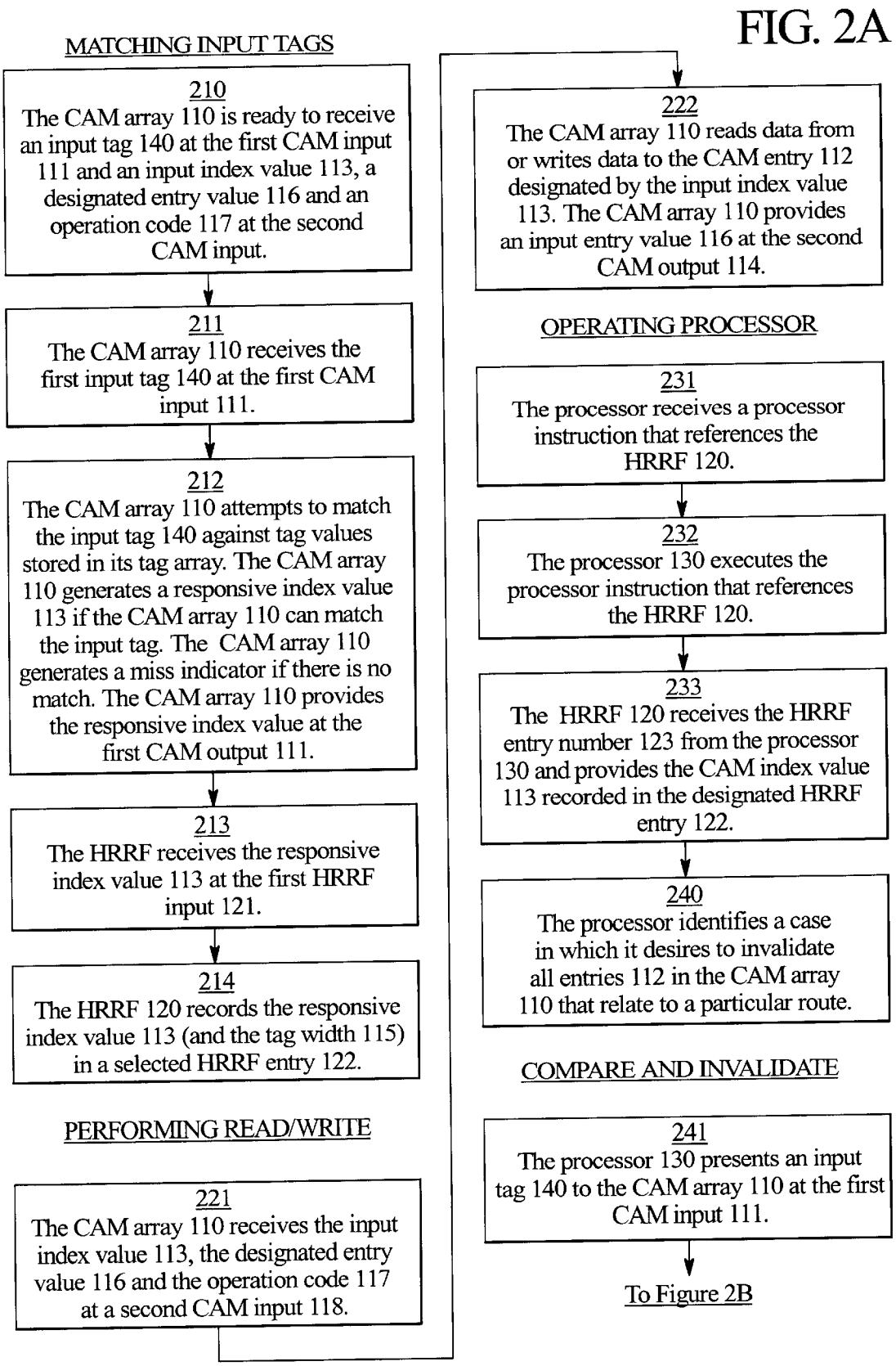

HIT RESULT REGISTER FILE USED IN A CAM

BACKGROUND OF THE INVENTION

1. Field of the Invention

This invention relates to content addressable memories.

2. Related Art

A CAM (content addressable memory) is sometimes used in a computer system or device for storing and retrieving information. CAMs have the advantage that they can rapidly link associated data with known tags; it is thus possible to perform rapid lookup of the associated data once the tag is known. Known CAMs include comparison circuits for matching an input tag with each tag recorded in the CAM, so as to determine which if any of the row or lines in the CAM matches the tag. If the input tag matches one or more tags recorded in the CAM, the CAM returns a matching entry (or an index thereof), also called a "hit."

In some known CAMs additional processing is performed on the value associated with the matching entry, such as to compare that associated value with a set of selected parameters and possibly validate or invalidate the associated value in response to those selected parameters. In the known art, special purpose circuits perform the additional processing, such as any compare-and-invalidate operations that may be desired.

A first problem in the known art is that special purpose circuits add complexity and take additional space on the chip in which the CAM is implemented. This limits the size of CAM that can be implemented in any chip of a pre-selected size, or limits the complexity or functionality of the special purpose circuits to be used with the CAM.

A second problem in the known art is that once the circuits embodying special purpose functions are embedded in the chip, they are fixed for that chip, and cannot generally be altered if new special purpose functions are desired.

A third problem in the known art is that circuits embodying special purpose functions do not always take the same amount of time to operate. This presents a drawback, in that operation of the CAM cannot be assured to take less time than the maximum time for any one of those special purpose functions. Where one or more special purpose function is a management function for clearing entries in the CAM, the time taken by that special purpose function can be quite large. This has a substantial effect on design of systems that include such a CAM.

Some known CAMs include a single status register for recording an index value for a result of the match. While this has the general advantage of providing the index value for later use by circuitry or a processor, it has the drawback that the status register would be overwritten by a next CAM operation, and so would be inefficient to attempt to use for generalized operations on the CAM. In practice, special logic is required because the status register is not useful.

Accordingly, it would be desirable to provide a technique for performing additional processing on CAM hit results, in which the additional processing does not add to the complexity or size of the CAM chip, in which the additional processing can be altered after manufacture of the CAM chip, and in which the additional processing does not delay other operations of the CAM. This advantage is achieved in an embodiment of the invention in which the CAM hit results are presented as indices into the CAM and sent to a hit result register file. The contents of the hit result register file can be processed by other hardware or software coupled to the CAM.

SUMMARY OF THE INVENTION

The invention provides a method and system for performing additional processing on CAM hit results, in which the additional processing does not add to the complexity or size of the CAM chip, can be altered after manufacture of the CAM chip, and does not delay other operations of the CAM. The CAM hit results returned from the CAM array and sent to a hit result register file where they are stored. The contents of the hit result register file can be processed by other hardware or software coupled to the CAM array. In a preferred embodiment, the index associated with the CAM input tag can be accessed using the hit result register file and a register indirect operation. In a preferred embodiment, the index associated with the CAM input tag can be used for CAM management functions in conjunction with (such as in parallel or pipelined) other CAM functions.

DETAILED DESCRIPTION OF THE PREFERRED EMBODIMENT

In the following description, a preferred embodiment of the invention is described with regard to preferred process steps and data structures. Those skilled in the art would recognize after perusal of this application that embodiments of the invention can be implemented using general or special purpose processors, or other circuits, adapted to particular process steps and data structures described herein. Implementation of the process steps and data structures described herein would not require undue experimentation or further invention.

System Elements

Figure 1:
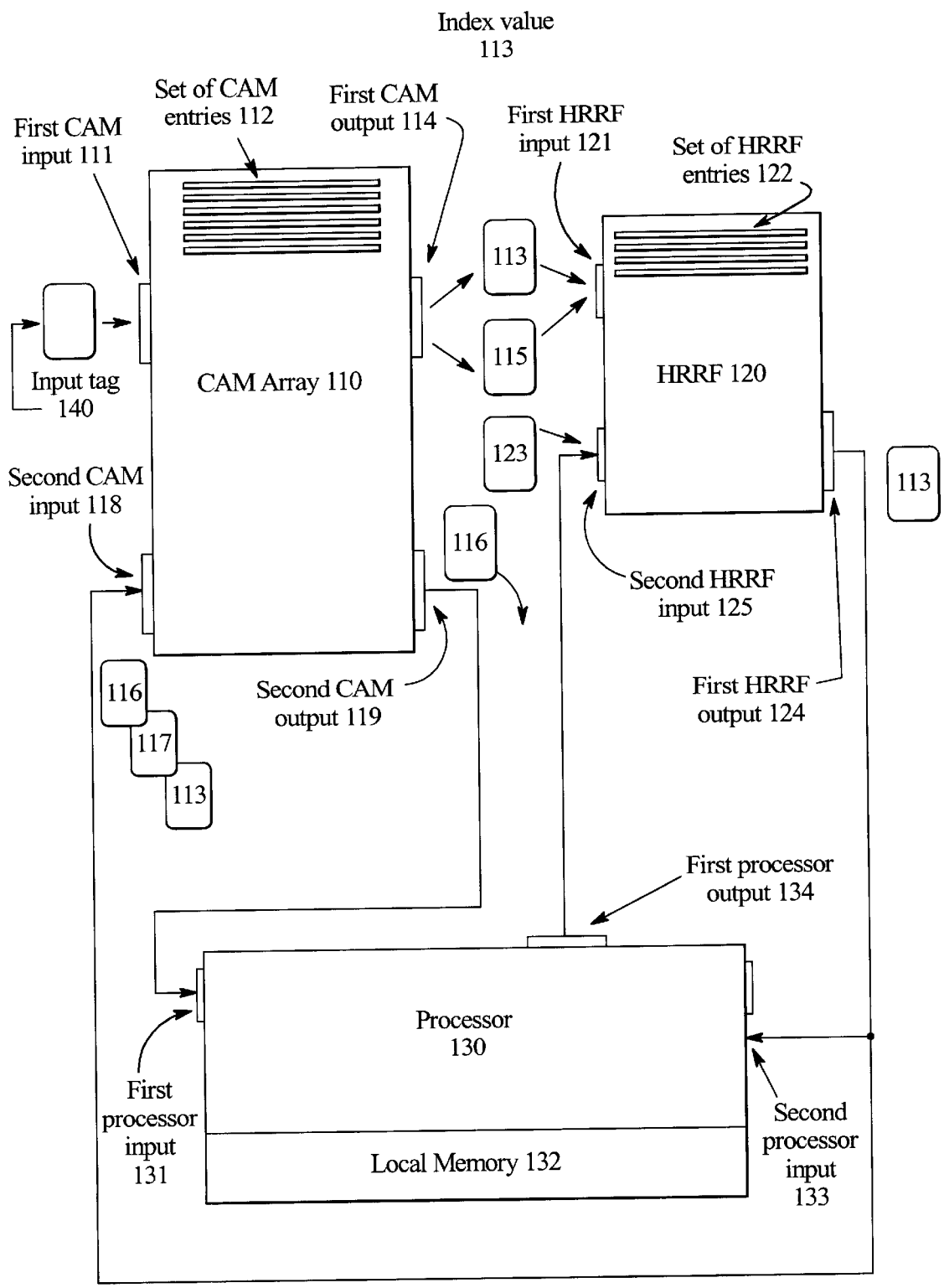
FIG. 1 shows a block diagram of a system including a CAM array and a hit result register file.

FIG. 1 shows a block diagram of a system including a CAM array and a hit result register file.

A system 100 includes a CAM (content addressable memory) array 110, a HRRF (hit result register file) 120, and a processor 130.

Content Addressable Memory

The CAM array 110 is disposed for receiving an input tag 140 at a first CAM input 111. The CAM array 110 includes a set of CAM entries 112, each including a tag value that might or might not match the input tag 140. (The CAM entries 112 can also include additional information, such as a data value associated with the tag value, management information for selected CAM entries related to operation of the CAM array 110, or other information.) The CAM array 110 is disposed for providing, in response to the input tag 140, an index value 113 of an entry matching the input tag 140 at a first CAM output 114.

As described below, in a preferred embodiment, the CAM array 110 is disposed for matching a set of input tags 140 of differing sizes. Thus, (for example), the CAM array 110 can be presented with an input tag 140 that is 40 bits wide, 72 bits wide, 144 bits wide, or 288 bits wide. The CAM array provides at the first CAM output 114 (in addition to the index value 113) an input tag width 115 that indicates the width of the input tag 140 that the CAM array 110 matched to produce that index value 113.

The first CAM output 114 is coupled to the HRRF 120 at a designated HRRF input 121. The HRRF 120 includes a set of HRRF entries 122, each of which is disposed for storing one selected index value 113. The HRRF 120 is disposed for receiving the index value 113 of the first CAM output 114 and for storing that index value 113 at a selected one of its HRRF entries 122.

The CAM array 110 is also disposed for receiving an input index value 113, an input entry value 116, and an input operation code 117 at a second input 118. In this context, the index value 113 specifically relates to a hit result. Similar to a random-access memory, the input operation code 117 can instruct the CAM array 110 to read from or to write to the CAM entry 112 designated by the input index value 113. The CAM array 110 responds to the input index value 113 and the input operation code 117 by reading from or writing to the designated CAM entry 112. The input entry value 116 is used when the CAM array 110 responds by writing to the designated CAM entry 112.

For example, the CAM array 110 can be instructed using the second CAM input 118 to insert data into a first selected CAM entry 112, to clear a second selected CAM entry 112, or to readout a third selected CAM entry 112. In a preferred embodiment, a portion of a selected CAM entry 112 can be altered by writing to a selected portion of a selected CAM entry 112 in the CAM array 110.

The second CAM output 119 may be coupled to the processor 130 at a first processor input 131. The processor 130 includes a local memory 132 disposed for recording information possibly including index values 113 and entry values 116. The processor 130 is disposed for receiving the entry value 112 (if read from the CAM array 110) at the second CAM output 119 and for recording that entry value 112 in its local memory 132.

Hit Result Register File

The HRRF 120 is disposed for receiving an input index value 113 (and selected additional information, such as a tag width value 115) from the first CAM output 114, at a first HRRF input 121. The HRRF 120 records the input index value 113 in one of its HRRF entries 122. Each HRRF entry 122 thus points to a selected CAM entry 112 (it is possible for two or more HRRF entries 122 to point to the same CAM entry 112).

In a preferred embodiment, the HRRF 120 includes eight HRRF entries 122. However, in alternative embodiments, the HRRF 120 can include more or fewer HRRF entries 122 (such as four HRRF entries 122, twelve HRRF entries 122, or sixteen HRRF entries 122). There is no particular requirement that the number of HRRF entries 122 must be a power of two.

The HRRF 120 is also disposed for receiving an input HRRF entry number 123 at a second HRRF input 125. In response to the input HRRF entry number 123, the HRRF 120 provides the CAM index value 113 recorded in the designated HRRF entry 122 at a first HRRF output 124.

Processor

The processor 130 is disposed for sending the HRRF entry number 123 from a first processor output 134 to the second HRRF input 125. The processor 130 is also disposed for receiving the CAM index value 113 recorded in the designated HRRF entry 122, from the first HRRF output 124 at a second processor input 133. In a preferred embodiment, the HRRF 120 is coupled to the processor 130 in a similar manner as a memory, so that the processor 130 can read or write HRRF entries 122 in similar manner as a memory. However, there is no particular requirement that the coupling between the HRRF 120 and the processor 130 be so generic.

The first HRRF output 124 is also coupled to the second CAM input 118, to provide the CAM index value 113 recorded in the designated HRRF entry 122 to the CAM array 110. When the processor 130 directs the HRRF 120 to provide that CAM index value 113 to the CAM array 110, the processor 130 also provides the entry value 116 to write (if a write operation is desired) and the operation code 117, at the second CAM input 118.

The processor 130 is thus able to perform a register indirect operation using one of the HRRF entries 122 as a pointer to a designated CAM entry 112. For example, the processor 130 can designate an HRRF entry number 123, a selected entry value 116 to write, and an operation code 117 designating a write operation. The processor 130 would thus write the selected entry value 116 to the CAM entry 112 whose index value 113 is recorded in the designated HRRF entry 122.

The processor 130 is thus able to read from and write to the CAM array 110 using the index values 113 which the CAM 110 provided in response to input tags 140. The CAM 110 is thus coupled to the processor 130 in similar manner as a memory, so that the processor 130 can read or write CAM entries 112 in similar manner as a memory. Thus, the processor 130 can obtain the actual CAM entries 112 that the CAM array 110 presented as matching the input tag 140, including their tag values and any additional information that might be present for those CAM entries 112.

Although it is desirable that the coupling between the CAM array 110 and the processor 130 is so generic, in alternative embodiments the coupling may be less generic while still providing functionality adequate to at least some of the purposes described below. Accordingly, such alternative embodiments are within the scope and spirit of the invention.

As noted above, the CAM array 110 responds to the index values 113 at the second CAM input 118, by presenting associated CAM entries 112 (when the processor operation is to read them), or other information (when the processor operation is otherwise) at a second output 119. The second CAM output 119 is coupled to the processor 130 at a first processor input 131.

Although in a preferred embodiment, the processor 130 provides the index value referring to an entry in the HRKF 120, and the HRRF 120 acts similarly to a random-access memory, alternative embodiments may be otherwise. In at least some alternative embodiments, the HRRF 120 may operate as a queue (such as a FIFO queue), and so select HRRF entries 122 for storage of index values 113 in a round robin manner. Queues are known in the art of computer science. In such alternative embodiments, the HRRF 120 would include a head pointer (not shown) and a tail pointer (not shown) for the queue.

Parallel or Pipelined Operation

The CAM array 110, the HRRF 120, and the processor 130 operate in a pipelined manner, so as to process in conjunction or in parallel a sequence of input tags 140 and a sequence of operations on the CAM array 110 by the processor 130. Pipeline processing is known in the art of computer architecture. Operational bandwidth of the CAM array 110 is thus shared among operations for differing purposes. In a preferred embodiment, these differing purposes include lookup operations for routing packets, and read/write operations for altering the contents of the CAM array 110.

In operation of the CAM array 110, each input tag 140 presented to the CAM 110 at the first CAM input 111 causes the CAM 110 to provide a responsive input index value 113 at the first CAM output 114.

Similarly, in operation of the HRRF 120, each responsive index value 113 presented by the CAM array 110 at the first HRRF input 121 causes the HRRF 120 to record that index value 113 in an HRRF entry 122. In conjunction or in parallel, each input HRRF entry number 123 presented by the processor 130 at the second HRRF input 125 causes the HRRF 120 to provide the index value 113 recorded in that designated HRRF entry 122 at a first HRRF output 124.

The processor 130 can thus operate in conjunction or in parallel with the CAM array 110 and the HRRF 120, directing the CAM 110 to perform random-access memory read/write operations interleaved with its associative memory lookup operations. In an alternative embodiment, the CAM 110 performs these operations in parallel with its associative memory lookup operations. Because the processor 130 can read and write the CAM array 110 (indirectly), the processor 130 can perform any computable operation on the contents of the CAM 110. Thus, the CAM 110 does not need specialized circuitry for any operation other than lookup and read/write operations. Moreover, processor 130 performs its operations under software control, so those operations are dynamically alterable.

CAM Management

The pipeline technique is well suited to management of the CAM array 110 for lookup operations for forwarding or other information about packets or cells in a router or switch. In a preferred embodiment, each input packet or cell includes information for lookup, using the input tag 140 as a lookup value and using the CAM array 110 as a constant-speed lookup table. The information to be looked up can be for forwarding, for access control, for quality of service, or for other management functions.

The CAM array 110 is managed by the processor 130 to assure that the CAM entries 112 are responsive to actual network topology and current administrative policies. This management arrangement is particularly useful because routing tables and administrative policies can change dynamically. The processor 130 provides management functions for entering CAM entries 112 into the CAM array 110 when they are new or clearing CAM entries 112 from the CAM array 110 when they are obsolete. Moreover, the CAM array 110 also performs lookup operations for routing as packets or cells are received and are directed for forwarding or other administrative processing.

The pipeline technique is also well suited to management of the CAM array 110 for interspersing lookup operations with management operations. By recording the index values 113 presented by the CAM 110 from its lookup operations, the HRRF 120 provides a buffering function for that information. Accordingly, lookup operations can occur at the full speed of the CAM array 110, without waiting to determine if the result of any lookup operation prompts the processor 130 to alter the contents of the CAM array 110 or to otherwise interrupt the processing of packets.

Example Complex Operation

For example, if the processor 130 desires to perform an operation on the CAM array 110 such as "clear all entries for a selected VLAN," the processor 130 can perform the following sub-operations in sequence.

First, the processor 130 presents an input tag 140 to the CAM array 110 to lookup entries for the selected VLAN. In a preferred embodiment, the CAM array 110 includes a ternary CAM with a global mask for at least some of the CAM entries 112. The processor 130 sets the mask so that the selected VLAN is the only unmasked part of each CAM entry 112, and presents the input tag 140 for the selected VLAN.

Second, the CAM array 110 responds to the input tag 140 for the selected VLAN by presenting an index value 113 for one (it does not matter which one) of its CAM entries 112 for the selected VLAN. The CAM array 110 presents that index value 113 to the HRRF 120, which records that index value 113 in a selected HRRF entry 122 (designated by an HRRF entry number 123).

The processor 130 monitors the hit result 126 (not shown) resulting from the lookup operation, and determines if that hit result 126 (not shown) indicates that no such entry was found. If so, there are no more entries for the selected VLAN, and the operation "clear all entries for a selected VLAN" is complete.

Third, the processor 130 performs a register-indirect write to that selected HRRF entry 122 indicated by HRRF entry number 123 (that is, the same HRRF entry number 123 as previously described) if there is a hit. In this event, the processor 130 directs the CAM array 110 to write a designated entry value 116 to that corresponding CAM entry 112. The designated entry value 116 clears the CAM entry 112, which generated the match with the selected VLAN, thus clearing one of the (possibly many) CAM entries 112 for the selected VLAN.

Method of Operation

Figure 2B:
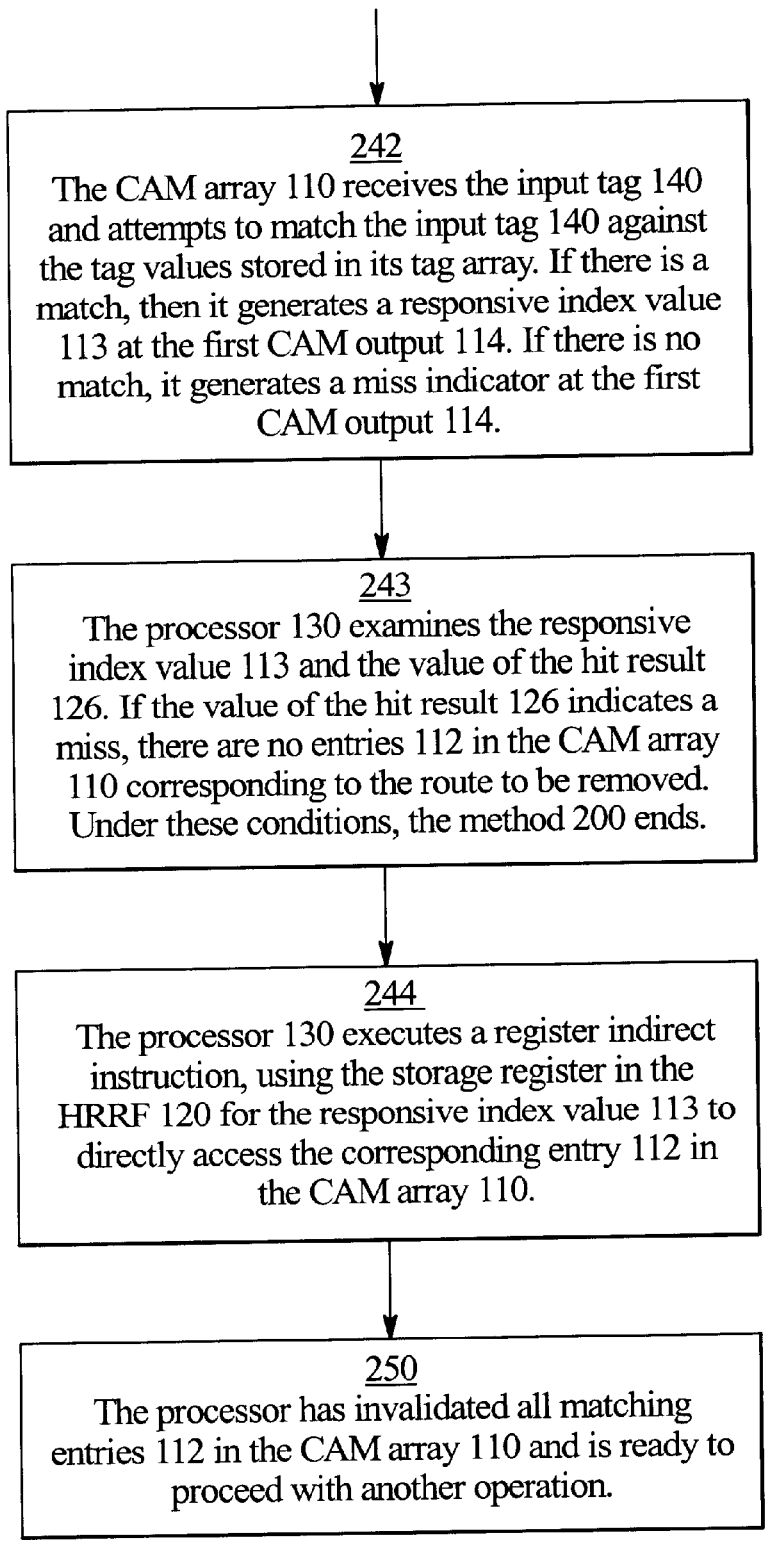
FIG. 2 shows a process flow diagram for a method of operating a system including a CAM array and a hit result register file, so as to perform additional processing on CAM hit results.

FIG. 2 shows a process flow diagram for a method of operating a system including a CAM array and a hit result register file, so as to perform additional processing on CAM hit results.

A method 200 is performed by the system 100, including the CAM array 110, the HRRF 120, and the processor 130. Although the method 200 is described serially, the steps of the method 200 can be performed by separate elements of the system 100 in conjunction or in parallel, whether asynchronously, in a pipelined manner, or otherwise. There is no particular requirement that the method 200 be performed in the particular order in which this description lists the steps, except where so indicated.

In a preferred embodiment, as noted above, the CAM array 110, the HRRF 120, and the processor 130 operate in a pipelined manner, so as to process a sequence of input tags 140 and a sequence of operations on the CAM array 110 by the processor 130, with operational bandwidth of the CAM 110 thus being shared.

At a flow point 210, the CAM array 110 is ready to receive an input tag 140 at the first CAM input 111 and an input index value 113, a designated entry value 116, and an operation code 117, at the second CAM input 118.

Matching Input Tag

A first sequence of steps relates to matching the input tag 140 at the first CAM input 111.

At a step 211, the CAM array 110 receives the first input tag 140 at the first CAM input 111.

At a step 212, the CAM array 110 attempts to match the input tag 140 against tag values stored in its tag array. If the CAM array 110 is able to match the input tag 140, it generates a responsive index value 113. If the CAM array 110 is not able to match the input tag 140, it generates a hit result 126 which indicates that there was no match (a miss). As part of this step, the CAM array 110 provides the responsive index value 113 at the first CAM output 114.

At a step 213, the HRRF 120 receives the responsive index value 113, the hit result 126 (indicating either a hit or a miss) and the tag width value 115, at the first HRRF input 121.

At a step 214, the HRRF 120 records the responsive index value 113, the hit result 126 (indicating either a hit or a miss) and the tag width value 115, in a selected HRRF entry 122.

The method 200 continues with the flow point 210, the CAM array 110 matching input tags 140 according to this first sequence of steps continually.

Performing Read/Write

A second sequence of steps, performed in conjunction or in parallel with the first sequence of steps, relates to performing the read/write operation designated by the processor 130 at the second CAM input 111.

At a step 221, the CAM array 110 receives the input index value 113, the designated entry value 116, and the operation code 117, at the second CAM input 118.

At a step 222, performed in conjunction or in parallel, the CAM array 110 reads data from (for a read operation) or writes data to (for a write operation) the CAM entry 112 designated by the input index value 113.

The method 200 continues with the flow point 210, the HRRF 120 receiving and recording index values 113 according to this second sequence of steps continually.

Operating Processor

A third sequence of steps, performed in conjunction or in parallel with the first sequence of steps, relates to the processor 130 performing management operations for the CAM array 110.

At a step 231, the processor 130 receives a processor instruction that references the HRRF 120. For example, the processor instruction can include a register indirect operation, so as to use a HRRF entry 122 to point to an entry in the CAM array 110.

At a step 232, the processor 130 executes the processor instruction that references the HRRF 120. To perform this step, the processor 130 presents an input HRRF entry number 123 to the HRRF 120 at the second HRRF input 125.

At a step 233, the HRRF 120 receives the input HRRF entry number 123 from the processor 130, and provides the CAM index value 113 recorded in the designated HRRF entry 122.

The method 200 continues with the flow point 210, the processor encountering and performing instructions according to this third sequence of steps continually.

Network Routing

In a preferred embodiment, the invention is used to perform operations using network routing information, such as found and used in a router or a switch. The CAM array 110 operates in this environment as a constant-speed lookup table, which is also capable of performing multiple lookup operations in parallel or in a pipelined manner.

The CAM entries 112 each include a tag value, which corresponds to a destination address (in a packet switched system) or a virtual circuit (in a circuit switched system). The tag value can also comprise a mask in embodiments in which the CAM array 110 includes a ternary CAM.

The CAM entries 112 each also include an index value 113, which corresponds to a pointer to a set of routing information in another memory. In a preferred embodiment, the routing information can include one or more of, or some combination of, the following.

Forwarding information, such as indicating an output interface to which to forward the packet. The output interface information can be responsive to a tag value constructed in response to at least a portion of a packet header, such as a destination address or port value, a source address or port value, a protocol type, a multicast indicator (indicating for example whether the packet is unicast or multicast), or a type of service indicator (indicating for example whether the packet is voice traffic or otherwise).

Access control information, such as indicating whether packets are authorized to proceed to the selected destination. The access control information can be responsive to a tag value constructed in response to at least a portion of a packet header, such as those portions of the packet header described with regard to forwarding information.

Quality of service information, such as indicating what quality of service is demanded or provided for packets (such as committed access rate, traffic latency, or traffic reliability). The quality of service information can be responsive to a tag value constructed in response to at least a portion of a packet header, such as those portions of the packet header described with regard to forwarding information.

Other administrative information, such as enforcing administrative policies for packet traffic (such as accounting, security control, or usage limitations). The other administrative information can be responsive to a tag value constructed in response to at least a portion of a packet header, such as those portions of the packet header described with regard to forwarding information.

Compare-and-Invalidate

One example of a network routing application is when the processor 130 desires to invalidate all entries 112 in the CAM array 110 that relate to a particular route. For example, that route might have been removed from the network topology, or otherwise so altered that corresponding entries should be removed.

At a flow point 240, the processor 130 identifies a case in which it desires to invalidate all entries 112 in the CAM array 110 that relate to a particular route.

At a step 241, the processor 130 presents an input tag 140 to the CAM array 110 at the first CAM input 111.

At a step 242, the CAM array 110 receives the input tag 140 and attempts to match the input tag 140 against tag values stored in its tag array. As noted above, if the CAM array 110 is able to match the input tag 140, it generates a responsive index value 113 at the first CAM output 114. If the CAM array 110 is not able to match the input tag 140, it generates a hit result 126 (a miss), which indicates there was no match, at the first CAM output 114.

In a preferred embodiment, the CAM array 110 might have more than one CAM entry 112 matching the input tag 140. In this case, the CAM array 110 selects one (in a preferred embodiment, the lowest numbered entry) such entry 112, and generates the responsive index value 113 in response to the selected one entry 112.

At a step 243, the processor 130 examines the responsive index value 113 and the value of the hit result 126. If value of the hit result 126 indicates miss, there were no entries 112 in the CAM array 110 corresponding to the route to be removed, and the method 200 ends.

At a step 244, the processor 130 executes a register indirect instruction, using the storage register in the HRRF 120 for the responsive index value 113, to directly access the corresponding entry 112 in the CAM array 110. In a preferred embodiment, to invalidate the entry 112, the processor 130 clears an entry-valid bit (not shown). In alternative embodiments, the processor 130 may clear the entire entry 112.

The method 200 continues with the flow point 240 to repeat the compare-and-invalidate operation until there are no matching entries 112 in the CAM array 110.

At a flow point 250, the processor 130 has invalidated all matching entries 112 in the CAM array 110, and is ready to proceed with another operation. The processor 130 knows that further processing is not required because the output of the CAM array 110 no longer indicates a hit.

Other CAM Management

The compare-and-invalidate example should serve to illustrate the generalized ability of the processor 130 to provide management functions for controlling CAM entries 112, including entering CAM entries 112 into the CAM array 110 when they are new or clearing CAM entries 112 from the CAM array 110 when they are obsolete.

Similarly to the compare-and-invalidate example, the processor 130 can determine what portion of its operations it will devote to operations for managing the CAM array 110, and what portion of its operations it will devote to performing routing information lookups using the CAM array 110.

Generality of the Invention

The invention is applicable not just to routers and switches, but to all CAM systems in which additional processing or pipelining of hit results is desired. More generally, when it is desired to manage the CAM in conjunction or in parallel with using the CAM for lookup purposes, the invention provides for dynamic adjustment of these uses of the CAM. The invention is superior to existing CAM systems in that it allows for that dynamic alteration or selection of CAM data and of processor bandwidth devoted to management of CAM data.

Alternative Embodiments

Although preferred embodiments are disclosed herein, many variations are possible which remain within the concept, scope, and spirit of the invention, and these variations would become clear to those skilled in the art after perusal of this application.

What is claimed is:

1. An apparatus for performing additional processing on content addressable memory (CAM) hit results, the apparatus comprising:
   a CAM array disposed to receive input tags and to generate index values; and
   a hit result register file disposed to receive, catalog, and send said index values back to the CAM array in such a way that said index values can be used to alter CAM entries.

2. The apparatus of claim 1, wherein the CAM array is disposed to match said input tags of varying sizes with entries in the CAM array.

3. The apparatus of claim 1, wherein the hit result register file includes a set of hit result register file entries, each entry of the set of hit result register file entries being disposed for storing one or more said index values in a manner that is responsive to the total number of said index values returned by the CAM array.

4. The apparatus of claim 1, wherein the CAM array is disposed to receive said index values, an input entry value and an input operations code.

5. The apparatus of claim 4, wherein the CAM array includes a plurality of CAM entries; and
   wherein the input operations code instructs the CAM array to read from or write to a specific one of the plurality of CAM entries indicated by at least one of said index values.

6. The apparatus of claim 1, including means for forming an address for addressing the CAM array.

7. The apparatus of claim 6, wherein said means for forming the address relies in part upon tag widths corresponding to said input tags.

8. A method comprising:
   providing an input tag value to a content addressable memory, the content addressable memory including a set of entries, each entry of the set of entries including tag and associated values;
   providing an associated value in response to a tag value, the associated value being responsive to at least one entry in the set of entries; and
   providing a pointer to the associated value to one of at least one result register.

9. The method of claim 8, including performing a register indirect operation on the pointer.

10. The method of claim 8, including processing the associated value using the pointer.

11. The method of claim 8, including:
    using a register indirect operation on the pointer to access the associated value;
    comparing the associated value with a selected set of lookup semantics; and
    validating the associated value in response to said steps for comparing.

12. The method of claim 8, including:
    using a register indirect operation on the pointer to access the associated value;
    comparing the associated value with a selected set of lookup semantics, the set of lookup semantics being dynamically selectable in response to a value external to the content addressable memory; and
    validating the associated value in response to said comparing the associated value with the selected set of lookup semantics.

13. The method of claim 8, including routing a message in response to the associated value.

14. The method of claim 8, including using a register indirect operation on the pointer to access the associated value.

15. The method of claim 14, wherein said using the register indirect operation includes using a null operation when the pointer shows a non-hit result.

16. The method of claim 14, including forming an address for addressing the content addressable memory.

17. The method of claim 16, wherein said forming the address relies in part upon a tag width corresponding to the input tag value.

18. A computer-readable medium containing computer-executable instructions for performing steps comprising:
    providing an input tag value to a content addressable memory, the content addressable memory including a set of entries, each entry of the set of entries including tag and associated values;
    providing an associated value in response to a tag value, the associated value being responsive to at least one entry in the set of entries; and
    providing a pointer to the associated value to one of at least one result register.

19. The computer-readable medium of claim 18, having computer-executable instructions for performing steps including performing a register indirect operation on the pointer.

20. The computer-readable medium of claim 18, having computer-executable instructions for performing steps including processing the associated value using the pointer.

21. The computer-readable medium of claim 18, having computer-executable instructions for performing steps including:

using a register indirect operation on the pointer to access the associated value;

comparing the associated value with a selected set of lookup semantics; and validating the associated value in response to said steps for comparing.

22. The computer-readable medium of claim 18, having computer-executable instructions for performing steps including:

using a register indirect operation on the pointer to access the associated value;

comparing the associated value with a selected set of lookup semantics, the set of lookup semantics being dynamically selectable in response to a value external to the content addressable memory; and validating the associated value in response to said comparing the associated value with the selected set of lookup semantics.

23. The computer-readable medium of claim 18, having computer-executable instructions for performing steps including routing a message in response to the associated value.

24. The computer-readable medium of claim 18, having computer-executable instructions for performing steps including using a register indirect operation on the pointer to access the associated value.

25. The computer-readable medium of claim 24, wherein said using the register indirect operation includes using a null operation when the pointer shows a non-hit result.

26. The computer-readable medium of claim 24, having computer-executable instructions for performing steps including forming an address for addressing the content addressable memory.

27. The computer-readable medium of claim 26, wherein said forming the address relies in part upon a tag width corresponding to the input tag value.

28. An apparatus comprising:

means for providing an input tag value to a content addressable memory, the content addressable memory including a set of entries, each entry of the set of entries including tag and associated values;

means for providing an associated value in response to a tag value, the associated value being responsive to at least one entry in the set of entries; and means for providing a pointer to the associated value to one of at least one result register.

29. The apparatus of claim 28, including means for performing a register indirect operation on the pointer.

30. The apparatus of claim 28, including means for processing the associated value using the pointer.

31. The apparatus of claim 28, including:

means for using a register indirect operation on the pointer to access the associated value;

means for comparing the associated value with a selected set of lookup semantics; and means for validating the associated value in response to said steps for comparing.

32. The apparatus of claim 28, including:

means for using a register indirect operation on the pointer to access the associated value;

means for comparing the associated value with a selected set of lookup semantics, the set of lookup semantics being dynamically selectable in response to a value external to the content addressable memory; and means for validating the associated value in response to said comparing the associated value with the selected set of lookup semantics.

33. The apparatus of claim 28, including means for routing a message in response to the associated value.

34. The apparatus of claim 28, including means for using a register indirect operation on the pointer to access the associated value.

35. The apparatus of claim 34, wherein said means for using the register indirect operation includes means for using a null operation when the pointer shows a non-hit result.

36. The apparatus of claim 34, including means for forming an address for addressing the content addressable memory.

37. The apparatus of claim 36, wherein said means for forming the address relies in part upon a tag width corresponding to the input tag value.

* * * * *

UNITED STATES PATENT AND TRADEMARK OFFICE
CERTIFICATE OF CORRECTION

PATENT NO. : 6,535,951 B1
DATED : March 18, 2003
INVENTOR(S) : Mark A. Ross

It is certified that error appears in the above-identified patent and that said Letters Patent is hereby corrected as shown below:

Title page,
Item [56], References Cited, U.S. PATENT DOCUMENTS, insert the following:

| | | |
|---|---|---|
| -- 3,648,254 | 3/1972 | Beausoleil |
| 4,296,475 | 10/1981 | Nederlof et al. |
| 4,791,606 | 12/1988 | Threewitt et al. |
| 4,996,666 | 2/1991 | Duluk, Jr. |
| 5,088,032 | 2/1992 | Bosack |
| 5,319,763 | 6/1994 | Ho et al. |
| 5,339,076 | 8/1994 | Jiang |
| 5,383,146 | 1/1995 | Threewitt |
| 5,404,482 | 4/1995 | Stamm et al. |
| 5,428,565 | 6/1995 | Shaw |
| 5,440,715 | 8/1995 | Wyland |
| 5,450,351 | 9/1995 | Heddes |
| 5,481,540 | 1/1996 | Huang |
| 5,515,370 | 5/1996 | Rau |
| 5,684,954 | 11/1997 | Kaiserwerth et al. |
| 5,740,171 | 4/1998 | Mazzola et al. |
| 5,802,567 | 9/1998 | Liu et al. |
| 5,841,874 | 11/1998 | Kempke et al. |
| 5,842,040 | 11/1998 | Hughes et al. |
| 5,852,569 | 12/1998 | Srivivasan et al. |
| 5,898,689 | 4/1999 | Kumar et al. |
| 5,920,886 | 7/1999 | Feldmeier |
| 5,930,359 | 7/1999 | Kempke et al. |
| 5,956,336 | 9/1999 | Loschke et al. |
| 5,978,885 | 11/1999 | Clark, II |
| 6,000,008 | 12/1999 | Simcoe |
| 6,041,389 | 3/2000 | Rao |
| 6,047,369 | 4/2000 | Colwell et al. |
| 6,061,368 | 5/2000 | Hitzelberger |
| 6,069,573 | 5/2000 | Clark, II et al. |
| 6,081,440 | 6/2000 | Washburn et al. |
| 6,091,725 | 7/2000 | Cheriton et al. |
| 6,097,724 | 8/2000 | Kartalopoulos |
| 6,134,135 | 10/2000 | Andersson |
| 6,137,707 | 10/2000 | Srinivasan et al. |
| 6,141,738 | 10/2000 | Munter et al. |
| 6,148,364 | 11/2000 | Srinivasan et al. |
| 6,154,384 | 11/2000 | Nataraj et al. |
| 6,175,513 | 1/2001 | Khanna |
| 6,181,698 | 1/2001 | Hariguchi |

UNITED STATES PATENT AND TRADEMARK OFFICE
CERTIFICATE OF CORRECTION

PATENT NO. : 6,535,951 B1
DATED : March 18, 2003
INVENTOR(S) : Mark A. Ross

It is certified that error appears in the above-identified patent and that said Letters Patent is hereby corrected as shown below:

Title page (cont'd),
| | | |
|---|---|---|
| 6,199,140 | 3/2001 | Srinivasan et al. |
| 6,236,658 | 5/2001 | Essbaum et al. |
| 6,237,061 | 5/2001 | Srinivasan et al. |
| 6,240,003 | 5/2001 | McElroy |
| 6,243,667 | 6/2001 | Kerr et al. |
| 6,246,601 | 6/2001 | Pereira |
| 6,295,576 | 9/2001 | Ogura et al. |
| 6,307,855 | 10/2001 | Hariguchi |
| 6,374,326 | 4/2002 | Kansal et al. |
| 6,377,577 | 4/2002 | Bechtolsheim et al. |
| 6,389,506 | 5/2002 | Ross et al. --. |

OTHER PUBLICATIONS, insert the following:
-- Jon P. Wade and Charles G. Sodini; "A Ternary Content Addressable Search Engine," Aug. 1989; pp. 1003-1013; IEEE Journal of Solid-State Circuits, vol. 24, No. 4.
Teuvo Kohonen, Content-Addressable Memories, 1987, pp. 128-129 and 142-144, Springer-Verlang, New York.
Brian Dipert, ed., "Special-purpose SRAMs Smooth the Ride," EDN, Jun. 24, 1999, pp. 93-104.
"Extending the LANCAM Comparand," Application Brief AB-N3, Rev. 1.0a Draft, Music Semiconductors, Milpitas, CA, Sep. 30, 1998, 4 pages.
"Advantages of CAM in ASIC-Based Network Address Processing," Application Brief AB-N11, Rev. 1.2a Draft, Music Semiconductors, Milpitas, CA, Sep. 30, 1998, 4 pages.
"Virtual Memory Applications of the MU9C1480A LANCAM," Application Note AN-N3, Rev. 1a, Music Semicondutors, Milpitas, CA, Sep. 30, 1998, 12 pages.
"Using the MU9C1965A LANCAM MP for Data Wider than 128 Bits," Application Note AN-N19, Rev. 1a, Music Semiconductors, Milpitas, CA, Sept. 30, 1998, 16 pages.
"Fast IPv4 and IPv4 CIDR Address Translation and Filtering Using the MUAC Routing CoProcessor (RCP)," Application Note AN-N25, Rev. 0a, Music Semiconductors, Milpitas, CA, Oct. 1, 1998, 16 pages.
"Using MUSIC Devices and RCPs for IP Flow Recognition," Application Note AN-N27, Rev. 0, Music Semiconductors, Milpitas, CA, Oct. 21, 1998, 20 pages.
"Wide Ternary Searches Using Music CAMs and RCPs," Application Note AN-N31, Rev. 0, Music Semiconductors, Milpitas, CA, Apr. 13, 1999, 8 pages. --.

UNITED STATES PATENT AND TRADEMARK OFFICE
CERTIFICATE OF CORRECTION

PATENT NO. : 6,535,951 B1
DATED : March 18, 2003
INVENTOR(S) : Mark A. Ross

It is certified that error appears in the above-identified patent and that said Letters Patent is hereby corrected as shown below:

Column 4,
Line 42, replace "HRKF" with -- HRRF --.

Column 7,
Line 56, replace "Forwarding" with -- • Forwarding --.
Line 66, replace "Access" with -- • Access --.

Column 8,
Line 5, replace "Quality" with -- • Quality --.
Line 13, replace "Other" with -- • Other --.

Signed and Sealed this

Thirteenth Day of December, 2005

JON W. DUDAS
*Director of the United States Patent and Trademark Office*